(12) United States Patent
Krause

(10) Patent No.: US 10,749,072 B2
(45) Date of Patent: Aug. 18, 2020

(54) NANOWIRE LIGHT EMITTING DEVICE

(71) Applicant: Silanna UV Technologies Pte Ltd, Singapore (SG)

(72) Inventor: Norbert Krause, Hawthorne (AU)

(73) Assignee: Silanna UV Technologies Pte Ltd, Singapore (SG)

( * ) Notice: Subject to any disclaimer, the term of this patent is extended or adjusted under 35 U.S.C. 154(b) by 0 days.

(21) Appl. No.: 16/295,299

(22) Filed: Mar. 7, 2019

(65) Prior Publication Data

US 2019/0288161 A1 Sep. 19, 2019

Related U.S. Application Data

(60) Provisional application No. 62/643,047, filed on Mar. 14, 2018.

(51) Int. Cl.
| | | |
|---|---|---|
| *H01L 33/18* | (2010.01) | |
| *H01L 33/32* | (2010.01) | |
| *H01L 33/00* | (2010.01) | |
| *H01L 33/36* | (2010.01) | |
| *H01L 33/30* | (2010.01) | |

(52) U.S. Cl.
CPC .......... *H01L 33/18* (2013.01); *H01L 33/0041* (2013.01); *H01L 33/0062* (2013.01); *H01L 33/0075* (2013.01); *H01L 33/30* (2013.01); *H01L 33/32* (2013.01); *H01L 33/36* (2013.01); *H01L 2933/0016* (2013.01)

(58) Field of Classification Search
CPC ............................ H01L 33/0041; H01L 33/18
See application file for complete search history.

(56) References Cited

U.S. PATENT DOCUMENTS

2017/0077226 A1* 3/2017 Oh ........................ H01L 29/861

OTHER PUBLICATIONS

Carnevale et al., "Three-Dimensional GaN/AlN Nanowire Heterostructures by separating Nucleation and Growth Processes," Department of Materials Science, The Ohio State University, Jan. 25, 2011, pp. 866-871.
Li et al., "Tailoring bandgap and trap distribution via Si or Ge substitution for Sn to improve mechanoluminescence in $Sr_3Sn_2O_7:Sm_3\rho$ layered perovskite oxide," Acta Materialia, Dec. 20, 2017, ttps://doi.org/10.1016/j.actamat.2017.12.003.
Terasaki, Nao et al., "Ultrasonic wave induced mechanoluminescence and its application for photocatalysis as ubiquitous light source," Catalysis Today, May 27, 2012, http://dx.doi.org/10.1016/j.cattod.2012.04.040.

* cited by examiner

*Primary Examiner* — Farun Lu
(74) *Attorney, Agent, or Firm* — MLO, a professional corp.

(57) ABSTRACT

Light emitting device and methods for forming the devices include a substrate and a nanowire placed on the substrate, where the nanowire comprises a core made of a semiconductor material. A cladding encloses the nanowire and has a breakdown voltage larger than a breakdown voltage of the core. A source of an electric field is provided, where the core is at least partially aligned with and lies at least partially within the electric field such that a cycling of the electric field creates charge separation and electron-hole recombination in the core.

12 Claims, 6 Drawing Sheets

NANOWIRE LIGHT EMITTING DEVICE

RELATED APPLICATIONS

This application claims priority to U.S. Provisional Patent Application No. 62/643,047, filed on Mar. 14, 2018 and entitled Nanofiber Light Emitting Device, which is hereby incorporated by reference in its entirety.

BACKGROUND

Semiconductor optoelectronic devices typically convert electrical energy into optical energy by taking advantage of the interaction of electrical energy with the semiconductor's crystal structure, which has a specific electronic energy configuration known as the electronic band structure. Semiconductor light emitting diodes (LEDs) generate light using semiconductor junctions comprising at least a p-type semiconductor region and an n-type semiconductor region. The p-type semiconductor region is designed to be a source of holes, whereas the n-type region is a source of electrons. Under the appropriate external electrical bias, electrons and holes are injected from their respective sources towards an intrinsic layer, which serves as an electron-hole-recombination (EHR) region. Group III-nitride (III-N) material is generally the most mature wide bandgap semiconductor material and is widely used in ultraviolet (UV) and visible LEDs in the wavelength range of 250 to 600 nm.

In semiconductor devices, the development of high crystalline structural perfection is necessary for achieving high performance in both electronic and optoelectronic devices. Group III-N epigrowth is typically performed on sapphire, silicon (Si) or silicon carbide (SiC) substrates, all of which have high lattice mismatch to III-N materials such as aluminum nitride (AlN) and aluminum-gallium-nitride (AlGaN). Growth of device stack epilayers on a dissimilar substrate material generates a large number of threading dislocations (e.g., on the order of $10^{10}$ cm$^{-2}$) in the epistack. Threading dislocations are defects which propagate vertically through an epifilm, usually originating at the interface between the substrate and epifilm. Threading dislocation density in the intrinsic layer of a semiconductor LED device is an important factor in determining the internal quantum efficiency (IQE) and therefore light output intensity of LEDs, as they provide non-radiative recombination sites; that is, recombination without producing photons. The presence of defects also affects other operational parameters, such as leakage currents and lifetime of the device.

Some optoelectronic devices emit light in the deep ultraviolet (DUV) wavelength range ($\lambda \leq 280$ nm) using group III metal nitride semiconductor materials, such as aluminum gallium nitride (AlGaN). However, the optical emission intensity from such LEDs to date has been relatively poor compared to visible wavelength LEDs. It has been widely believed that a poor deep ultraviolet emission intensity in DUV LEDs is due to an inferior crystalline structural quality of deposited group III metal nitride materials which leads to poor electrical behavior of the LEDs. In comparison with other technologically mature group III-V compound semiconductors, such as gallium aluminum arsenide (GaAlAs), the group III metal nitrides exhibit crystalline defects at least two to three orders of magnitude higher. These defects reduce efficiency by causing radiationless EHR. The structural quality of the group III metal nitrides can be improved by epitaxial deposition on native substrates, such as, aluminum nitride (AlN) and gallium nitride (GaN).

In recent studies, the use of nanofibers in light emitting devices has been investigated since in general, thin fibers are less likely to have defects due to the relative relaxation in the x-y plane. For example, GaN and AlN nanofibers have been demonstrated to be virtually defect-free. Surface defect states that plague the nanofiber devices so far can be reduced or eliminated by a suitable growth and/or a cladding such as AlN or atomic layer deposition oxides as has been demonstrated in recent literature.

Mechanoluminescent (ML) materials are also being researched as a way for generating light. ML materials are typically solid materials, such as particles in a powder form, that emit visible light when mechanical stress is applied. Types of mechanical stress include deformation, friction, and impact.

SUMMARY

A light emitting device includes a substrate, a nanowire placed on the substrate, a cladding enclosing the nanowire, and a source of an electric field. The nanowire comprises a core made of a semiconductor material. The cladding has a breakdown voltage larger than a breakdown voltage of the core. The core is at least partially aligned with and lies at least partially within the electric field such that a cycling of the electric field creates charge separation and electron-hole recombination in the core.

In some embodiments, the semiconductor material is a piezoelectric material which is the source of the electric field. The nanowire is attached to the substrate such that movement of the substrate creates and releases mechanical strain on the piezoelectric material of the core. The mechanical strain on the piezoelectric material of the core creates the cycling of the electrical field.

In some embodiments, the core comprises an inner core and an outer core. The outer core covers the inner core, has a wider bandgap than the inner core, and is made of a piezoelectric material that is the source of the electric field. The nanowire is attached to the substrate such that movement of the substrate creates and releases mechanical strain on the outer core. The mechanical strain on the outer core creates the cycling of the electrical field.

In some embodiments, the light emitting device includes a pair of electrodes on the substrate and an electrical circuit coupled to the pair of electrodes. The electric field is through the pair of electrodes generated by the electrical circuit and cycles between a zero bias and a non-zero bias. At least part of the nanowire is located within the electric field generated by the electrical circuit.

The present embodiments also include methods for fabricating a light emitting device. A plurality of nanowires is formed, the nanowires comprising cores made of a semiconductor material. The plurality of nanowires is collected and placed on a substrate. A cladding is deposited to enclose the plurality of nanowires, where the cladding has a breakdown voltage larger than a breakdown voltage of the cores. A source of an electric field is provided, where the cores of the plurality of nanowires are at least partially aligned with and lie at least partially within the electric field such that a cycling of the electric field creates charge separation and electron-hole recombination in the cores.

DETAILED DESCRIPTION

The present embodiments disclose light emitting devices made of nanowires (which may also be referred to as nanofibers or wires in this disclosure), and in particular, where the nanowires are the emission sources themselves without the need for external electrodes to contact the wires as in conventional devices. One type of nanowire device in the present disclosure uses an external electrical circuit to generate an electric field. The electric field causes charge separation of electrons and holes in a core material, where the electrons and holes then recombine to emit light when the field is neutral. Another type of nanowire device in the present disclosure is a piezoelectric fiber that is subjected to mechanical strain, where the strain creates an electric field in the piezoelectric material. The electric field causes the charge separation of electrons and holes in a core material which recombine radiatively when the strain is released. For either type of nanowire device, the wires have a cladding which constrains the generated holes and electrons to remain in the core material and also is transparent to allow light to be emitted from the nanowire. Additionally, the wires can be made defect-free or with relatively few defects compared with conventional light emitting devices, since the wires are formed separately from, and then deposited onto, the device substrate.

The present embodiments solve issues associated with crystal defects that form during conventional heterogeneous epitaxial growth processes and lead to Shockley-Read-Hall (SRH) losses, while avoiding problems usually associated with nanowires. In particular, the present nanowire devices solve the low efficiency problems of UV-C LEDs (wavelengths from 100 to 280 nanometers). At the same time, the devices allow radiative area and non-planar emitter shapes that are independent of the growth reactor used to fabricate the nanowires. The present embodiments enable a move toward larger emitter areas compared to 2D-grown layers of conventional LEDs, and potentially an independence from large epitaxial reactor growths.

The present nanowire devices utilize the effect of impact breakdown, where a free electron accelerated under a high field creates an electron-hole pair. The electron and the hole are then separated and collected at opposite ends of the wire. The concepts eliminate the need for individual electrical contact with the wires, thus simplifying manufacturing of the devices and removing resistive losses in the n- and p-doped regions. There is also no doping required, in contrast to the doping required in conventional p-i-n devices. The concepts further rely on the absence of electron-hole recombination under a biased condition; that is, the charges are "stored" until the recombination at zero bias can occur.

External Electric Field Stimulated Nanowire Devices

Figure 1:
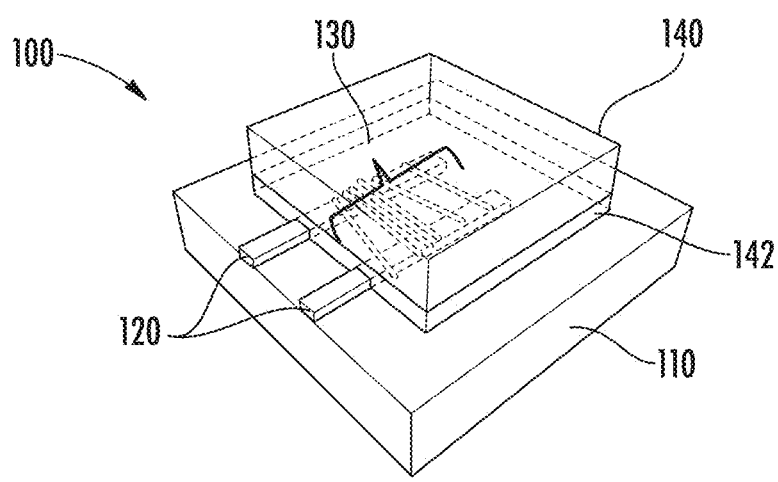
FIG. 1 is a perspective view of an electrically-activated nanowire light emitting device, in accordance with some embodiments.

FIG. 1 shows a perspective view of a nanowire device 100 in which light emission is initiated by an electrical field imposed on the wires. Device 100 includes a substrate 110 on which a pair of electrodes 120 is placed, and a plurality of nanowires 130 that are located between the electrodes 120. Substrate 110 can be, for example, a quartz wafer or sapphire. The nanowires 130 (which may also be referred to as "wires" or "fibers" in this disclosure) have a core made of a semiconductor material, such as AlN, GaN or AlGaN, where the core can comprise at least an interior portion or an entirety of the nanowires. The nanowires 130 can be fabricated independently of the device 100. That is, isolated nanowires can be grown in processes that are independent of the size or material of substrate 110, and then transferred onto the substrate 110. Cladding layers 140 and 142 enclose the wires 130 and electrodes 120, respectively, and are coatings having a breakdown voltage higher than the core material of the wires 130. For example, cladding layers 140 and 142 can be an oxide.

The nanowires 130 can have a length that spans the entire distance between electrodes 120 as shown in FIG. 1, or in other embodiments can have a length that is less than the distance between the electrodes. In some embodiments the nanowires can have a variety of wire lengths, such as a mixture of lengths that span the entire distance between electrodes with some that are shorter and some that are longer than the distance between the electrodes. The wires 130 are not in contact with the electrodes 120, and only need to be placed so that they are subjected to the electric field created by the electrodes 120. Also, although the wires 130 are depicted as being laid in a single layer, in other embodiments the electrodes can overlay each other in one or more layers. The wires 130 are at least partially aligned with the electric field created by electrodes 120, such as being perpendicular to or at a non-parallel angle with the linear electrodes 120, or a combination thereof. For example, the wires 130 can be randomly dispersed between the electrodes, as long as at least some of the wires 130 are properly aligned within the electric field that will be generated by the electrodes 120 (i.e., having their length at least partially oriented along the direction of the electric field). In some embodiments, the electrodes need not be a pair of linear strips as shown in FIG. 1 but can have other geometries including but not limited to dots, more than two stripes, and the like. The length of wires 130 can be much shorter or much longer than the distance between electrodes, as long as at least a portion of the wires are within the electric field created by the electrodes 120.

In some embodiments, not all of the wires or the entire lengths of the wires need to achieve light emission. For example, a portion of a particular wire that is not properly aligned with, or not located within, the electric field may not emit light, while other portions of that wire will emit light. In another example of wires with varying lengths, each wire will receive a portion of the overall voltage, such that some wires will have an insufficient electric field to initiate charge separation while other wires will.

Figure 2A:
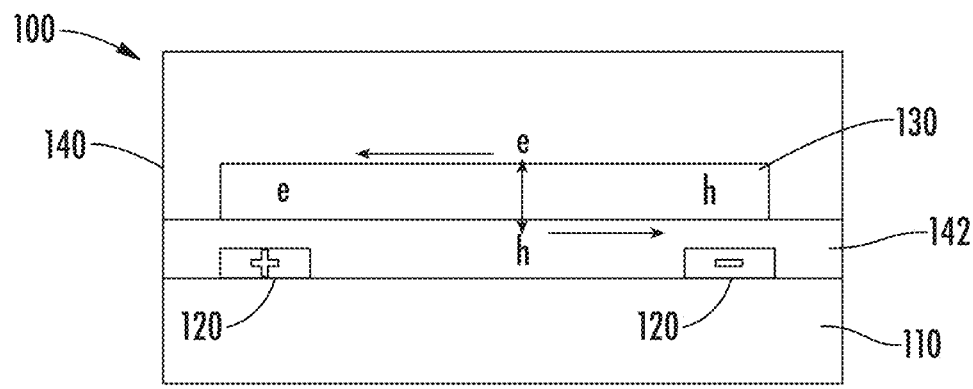
FIGS. 2A-2C are end view schematics of the device of FIG. 1, in accordance with some embodiments.
Figure 2B:
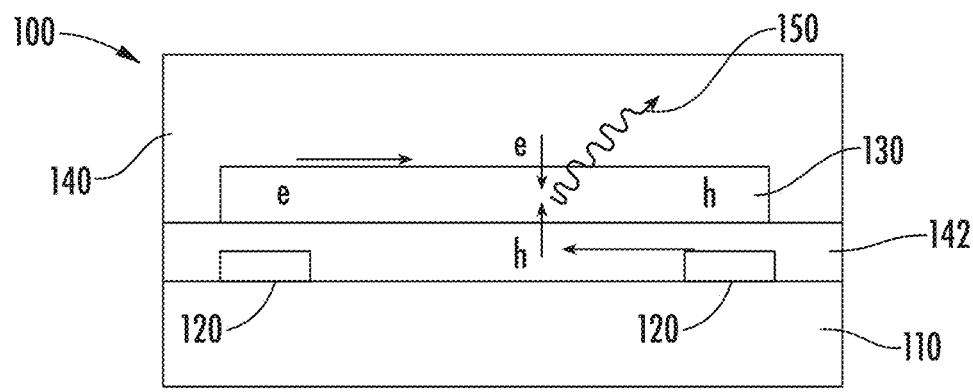
Figure 2C:
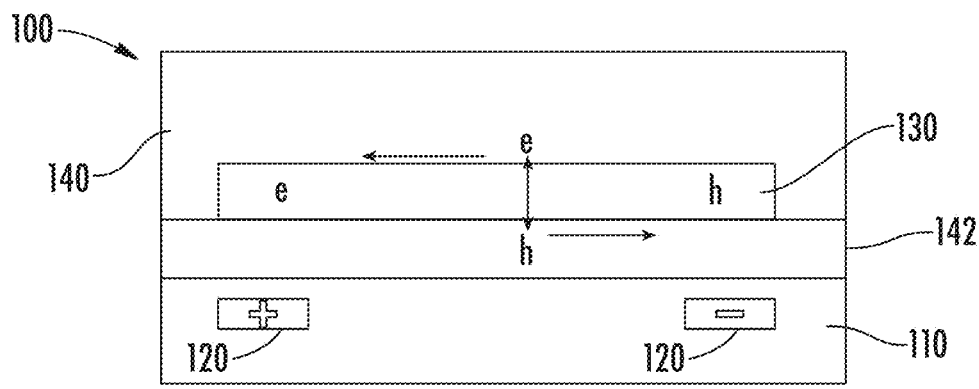

FIGS. 2A-2C are schematic end views demonstrating the principle of operation of the device 100. In FIG. 2A, a voltage is applied, as represented by the "+" and "−" annotated on the electrodes 120. The resulting electric field creates electron-hole pairs due to impact ionization which undergo charge separation. The separated charges (electrons "e" and holes "h") are held at opposite ends of the wire 130 near the electrodes 120 due to the bias created by the electrodes. In FIG. 2B, the electric field is in a neutral state or is turned off, as indicated by no charge symbol on the electrodes 120. FIG. 2B shows the recombination of charges in the resulting zero bias field, indicated by the electrons "e" and holes "h" moving away from the electrodes 120 and toward the central portion of the wire 130, where they recombine and emit light 150.

The wires 130 are covered by a first cladding 140 that serves as an insulator, such as an oxide. In this embodiment, the electrodes 120 have been placed on the substrate 110 and are enclosed by second cladding 142. Second cladding 142 is an insulator, such as an oxide. Thus, wires 130 are not in contact with the electrodes 120, being separated from the electrodes by second cladding 142. Other constructions are possible. For example, in FIG. 2C the electrodes 120 are buried in the substrate 110, rather than being enclosed by second cladding 142. In other embodiments, an inverted structure may be utilized where the wires 130 are placed on the substrate 110 and covered with first cladding 140, then the electrodes 120 can be placed over the oxide-covered wires 130. Second cladding 142 would then be deposited to cover the electrodes 120, to prevent the electrodes from breaking down.

Figure 3A:
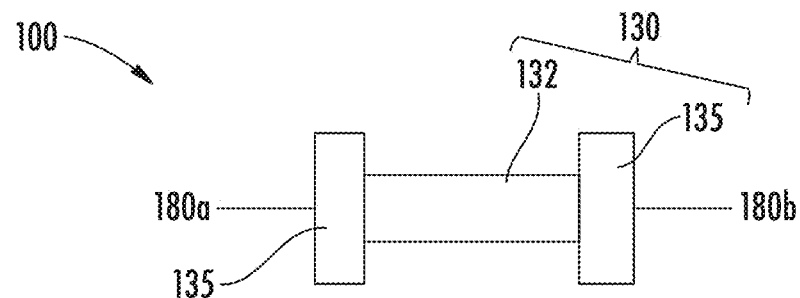
FIGS. 3A-3D are band diagrams of the device of FIG. 1, in accordance with some embodiments.

FIGS. 3A-3D show the working principle of the device 100 using band diagrams taken along the length of the wire 130. In FIG. 3A, the schematic band diagram shows a wide bandgap semiconductor inner core 132 of nanowire 130 terminated on either side with an outer core 135 that is a wider bandgap material (e.g., an oxide) than the inner core material 132. The cladding 140 of FIG. 1 and FIG. 2 is not shown in FIGS. 3A-3D, for clarity. Inner core material 132 and outer core 135 are both components of the nanowire 130, where the inner core 132 and outer core 135 together may also be referred to as a core 130. The semiconductor inner core 132 and its wider bandgap outer core 135 are free of crystalline defects or very low in defects compared to conventional 2D grown LED materials. The nature of the outer core material 135 is such that dangling bonds on the surface of the nanowire inner core 132 are terminated, again to the effect of very low defect density. The electric field in FIG. 3A is zero, as indicated by the electrode potentials 180a and 180b being at the same level; that is, at the same height in this illustration.

Figure 3B:
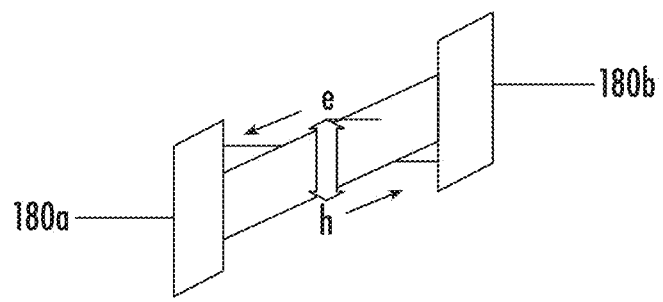

In FIG. 3B the structure is exposed to an external electric field, which is indicated by electrode potential 180b being higher than electrode potential 180a. The electric field is so high that a partial dielectric breakdown occurs in the semiconductor inner core 132—indicated by the generation of electrons "e" and holes "h" in FIG. 3B—while it is low enough to maintain electrical integrity on the outer core 135. On breakdown, an electron/hole avalanche will form which starts charging the opposite ends of the wire until the field from the free charges compensates the external field enough to stop any further charge generation via breakdown. It is important to realize that the electrons and holes are static and stable and will not be able to leave their respective potential minimum.

Figure 3C:
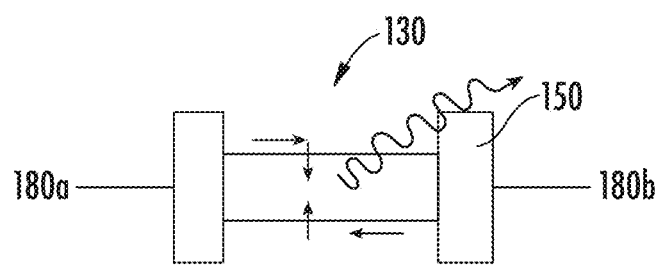

In FIG. 3C the external field is off, as again being indicated by electrode potentials 180a and 180b being at the same level. In this zero field, the electrons and holes will mutually attract each other and will radiatively recombine to emit light 150. The absence of defects in the nanowire 130 will remove the possibility of electrons and holes to recombine non-radiatively, and thereby the radiative recombination efficiency will be near 100%. There is also no electron overshoot associated with p-i-n junctions as in conventional LEDs, and there are no resistive losses associated with p- and n-doped conducting paths in p-i-n diodes.

Figure 3D:
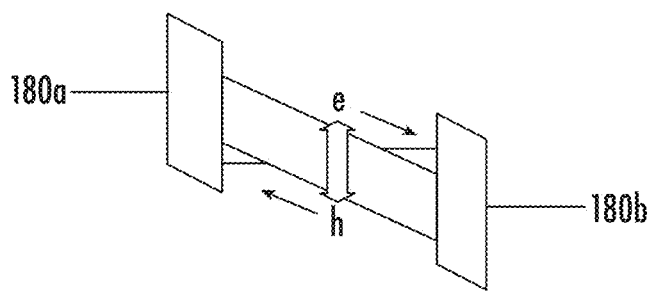

FIG. 3D shows the next cycle breakdown with a negative electric field applied, where electrode potential 180a is higher than electrode potential 180b. This cycle of FIGS. 3A-3D can represent the external electric field being applied as, for example, a sinusoidal or pulsed function. The cycle of FIGS. 3A-3D repeats, such that the device 100 emits light as the electrons and holes continue to separate and recombine due to the bias to the electrodes being periodically switched between zero field and positive and negative bias. Various types of functions can be used in applying the cyclical electric field, such as sinusoidal, square, pulsed, triangle, or sawtooth, including unipolar or bipolar embodiments. The functions can be applied at various frequencies, such as on the order of 100 kHz, or at least 50 kHz, or at least 80 kHz, or at least 100 kHz, where in general high frequencies are desirable for more continuous light emission.

The energy required to generate electron hole pairs will be determined by the charging and discharging of the individual capacitances of the nanowires. The electric field stimulated device can use operating biases between, for example, 10V and 1000V depending on the exact geometry and breakdown characteristics of the semiconductor nanowire materials. Typically, a voltage of at least 1.5 times the bandgap of the materials (i.e., the semiconductor material of the core) is needed to create the electron-hole separation. The distance between electrodes will also affect the operating bias needed, where the greater the distance, the higher the voltage. The distance between electrodes can be, for example, 0.5 micron to 1 mm.

In some embodiments, a high frequency alternating current (AC) bias is applied to the electrode array. The peak bias in the cycle induces an impact ionization breakdown in sufficiently aligned wires that results in electrons and holes separated by the field and building a counter electric field that stops the breakdown process. Wires aligned well to the field (e.g., at an angle of 45° or less relative to the electric field) break down earlier than wires that are less aligned with the electric field. If the wires are placed randomly onto the substrate, then some wires will not be properly aligned with the electric field, so they will not break down at all. Once the electric field is zero, the electrons and holes will spread across the wire and can recombine to produce light. As there are little or no defects, the emission efficiency of the wires is expected to be near 100%. The insulation (e.g., oxide) provided by the cladding with its higher breakdown voltage does not break down, hence the current through the device is limited per each cycle.

In other embodiments of the external electric field device, multiple electrode pairs can be utilized where the electrode pairs have different orientations relative to each other so that the wires do not need to be aligned in a particular manner. For example, two pairs of electrodes can be provided on the substrate, where one pair is orthogonal to a second pair. Additionally, other electrode pairs can be provided and placed at different angles between 0-90° relative to the first two pairs. The electrode pairs can be positioned such that the wires are located within the electric fields generated by each of the electrode pairs. The electric fields generated by the different electrode pairs will cross each other. As a result of having electrodes at different orientations, every wire on the wafer (i.e., substrate) will be aligned at least 45° relative to one of the electric fields if two orthogonal electrode pairs are used, or less than 45° if more electrode pairs are present. In operation, the first pair of electrodes is pulsed, then the second pair pulsed, and any other pairs pulsed sequentially.

Providing electrodes at different orientations can Increase the utilization of the number of wires active and hence increase their lifetime.

Figure 4:
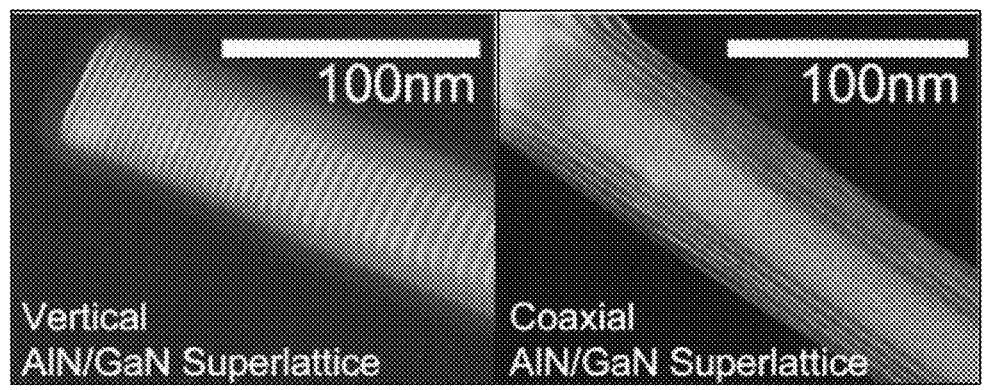
FIG. 4 shows scanning electron microscope images of nanowires constructed using superlattices, as known in the art.

The semiconductor material for the nanowires 130 (i.e., inner core 132 if an inner and outer core are used) can be any direct, wide bandgap material, such as but not limited to GaN, AlGaN, AlN/GaN superlattice (SL), AlN, oxides (e.g., GaO, MgO, CaO), fluorides, or diamond. The material for cladding 140 can be chosen from the same group of materials or also from amorphous materials such as, but not limited to, $SiO_2$, $Al_2O_3$, and HfO. The material for outer core 135—if included—can be any wider bandgap material than the inner core 132. The materials described in this paragraph are particularly suited for deep UV emission, such as UV-C. In some embodiments, the wire can also be made from a composite material or a nano-structured material, as can be seen in the known complex superlattice wire structure including cladding of FIG. 4.

The concept of device 100 is based on the following principles: 1) it is possible to form nanowires of AlGaN or AlN/GaN SL with AlN outer core that have very low defect densities along the wire volume or at the AlN interface to AlN/GaN SL; 2) nanowires that emit transverse magnetically (TM) ideally operate flatly aligned to a surface; 3) it is possible to generate impact ionization processes in wires aligned to the electrical field; 4) electrons and holes do not recombine radiationless in the absence of defects; and 5) tunneling from external electrodes is inhibited by long enough distances.

In general, a wire can be laid flat (i.e., horizontally) on the substrate so that radially emitted light is able to emit vertically away from substrate. However, in other embodiments a wire can also be aligned in any other way relative to the surface by surface engineering, such as extending vertically or non-horizontally relative to the substrate surface.

The overall efficiency of the device may be as high as 10% or more, which is improved compared to conventional efficiencies of approximately 1% for UV-C LEDs. The total efficiency will depend on the optical emission efficiency, the electron/hole pair generation efficiency and the losses from non-radiative recombination and trapping. The optical emission efficiency can be very high for the case of sparse wire emission. The losses from recombination and trapping will depend on the quality of the wire growth. The surface and interface to the cladding will also impact efficiency, which may be a tradeoff to the bulk defect density as the wire is made thicker. The electrical losses will incur the limited efficiency of the impact breakdown with some excess energy of the avalanche being lost to the crystal and with some energy lost due to non-avalanching collisions. Further, the high frequency circuit used to energize the electrodes will have a limited efficiency.

In an example embodiment, the overall wall plug efficiency (WPE) is 11% under the following assumptions: zero losses from trapping and radiationless recombination; efficiency of electron-hole generation is 25%; optical efficiency is 50%; external circuit efficiency is 90%.

Piezoelectric Nanowire Devices

In addition to the above device concept with an external bias providing the breakdown field, other embodiments of nanowire devices generate an internal electrical field in piezoelectric materials via the application of mechanical strain to the wire. In these piezoelectric embodiments, the use of high voltage can be avoided, and the cladding material that encloses the wires is exposed to less electrical stress. Another benefit of piezo stimulation is the option to move towards very high frequencies, thereby increasing the output power linearly with frequency. The limit of the upper frequency is practically given by the wire length and the electron and hole mobility.

Figure 5A:
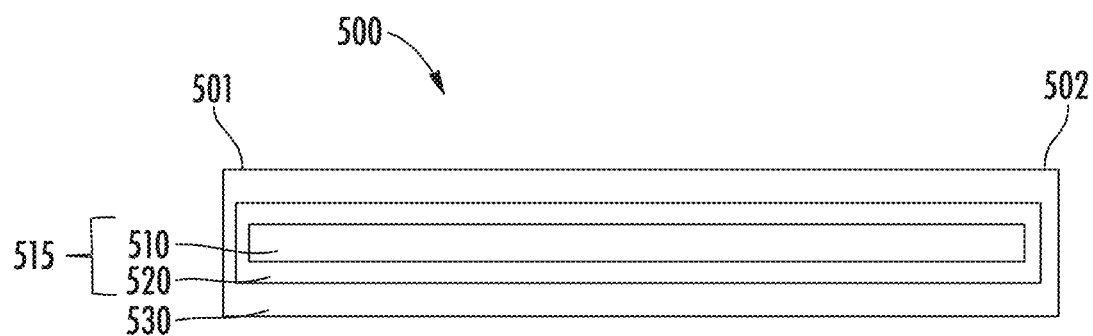
FIGS. 5A-5C are schematics of a piezoelectric nanowire for a light emitting device, in accordance with some embodiments.
Figure 5B:
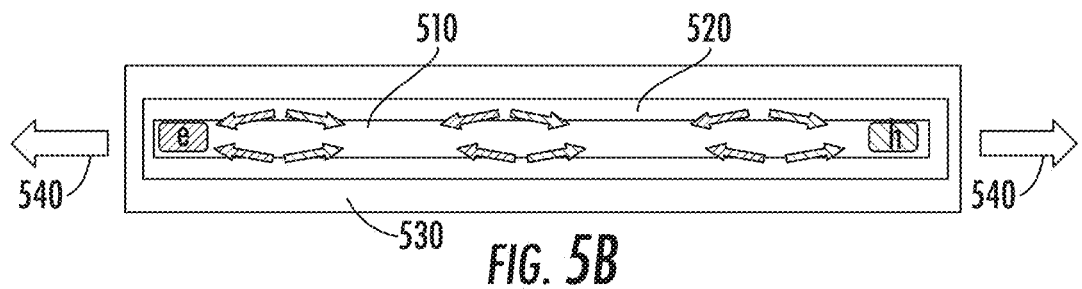
Figure 5C:
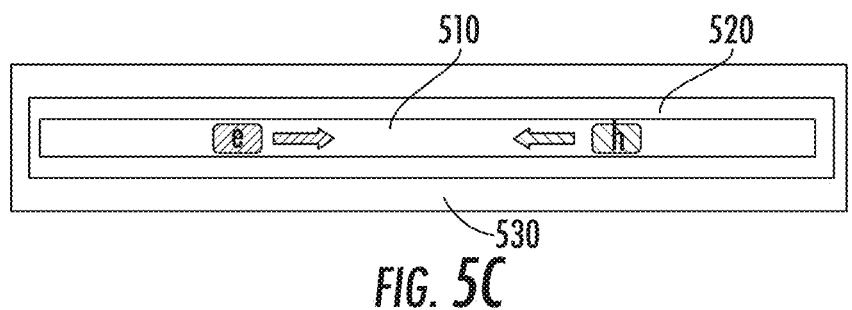

FIGS. 5A-5C are lengthwise cross-sectional schematics of a piezoelectric nanowire 500 which has a core 515 comprising an inner core 510 and an outer core 520. The core 515 is covered by cladding 530. The nanowire 500 will become part of a piezoelectric light emitting device. Note that in other embodiments, the core 515 may only consist of inner core 510 or may be a single core that has a combination of the materials described below for inner core 510 and outer core 520.

In the embodiment of FIGS. 5A-5C, inner core 510 is a direct semiconductor material where the electron-hole separation and recombination occur. Outer core 520 is a piezoelectric, wider bandgap semiconductor than inner core 510, and which generates an electric field when subjected to strain. Cladding 530 is a non-piezoelectric, wide bandgap insulator that constrains the electrons and holes to remain in the wire. Three states of the wire 500 are shown, starting with non-biased wire 500 in FIG. 5A. Some or all of the length between opposite ends 501 and 502 of wire 500 is fixedly attached to a substrate (substrate 580 in FIG. 6), which may also be referred to as a membrane in this disclosure. Substrate materials include, for example, piezoelectric resonator membranes or solid blocks, or any mechanical structure that can supply enough strain and at high enough frequency on the wires. The wire 500 can be coupled to the substrate by depositing a layer of material (not shown) over all the nanowires 500 in the assembled device, such as by depositing an oxide using plasma-enhanced chemical vapor deposition (PECVD). This coating layer for affixing the wires to the substrate can be a different processing step from depositing the oxide coating to form outer core 520. For example, the outer core 520 can be a very high-quality oxide deposited using atomic layer deposition (ALD), rather than CVD for the substrate-adhering layer of cladding 530.

FIG. 5B shows charge generation of electrons "e" and holes "h" in the inner core 510 due to the electric field that is created in outer core 520 via mechanical strain 540. The mechanical strain 540 can be generated by, for example, flexing of the membrane on which the wire 500 is mounted. Finally, in FIG. 5C the recombination of electrons and holes which results in light emission is shown in inner core 510, after the strain is released.

The cladding of the piezoelectric nanowire 500 experiences less electrical stress than conventional optoelectronic devices. For example, in typical UV-emitting materials such as AlN and GaN, the breakdown strength is about 150 MV/m. The piezoelectric effect in such materials allows the generation of an electric field of 100-200 MV/m under 1% strain in the z-direction along the wire axis. For a non-piezoelectric cladding material, the electric field strain is low, thereby avoiding breakdown in the cladding material and lifetime issues in the mechanically driven device.

In some embodiments, color centers or impurities can be used in the wire core 515 (inner core 510 and/or outer core 520). The color centers emit electrons and holes under longer wavelength light and/or thermal excitation into the conduction and/or valence band, where impact ionization occurs again. Color centers can be, for example, rare earth materials chosen based on the desired wavelength to be emitted.

Figure 6:
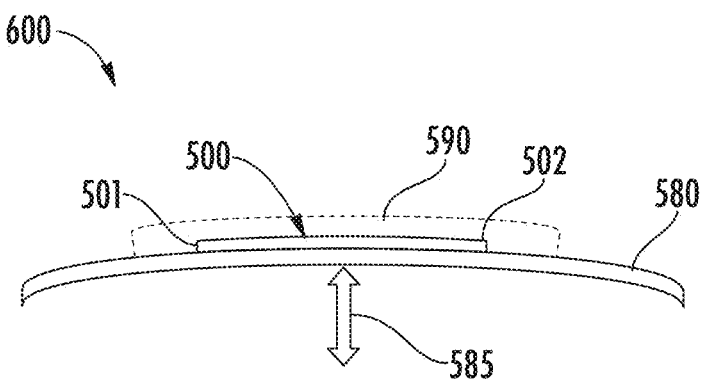
FIG. 6 is a side view of a piezoelectric nanowire light emitting device, in accordance with some embodiments.

In an example embodiment of the concept shown in the piezoelectric light emitting device 600 of FIG. 6, the piezoelectric wire 500 can be assembled onto a thin membrane substrate 580. Some or all of the length between the ends 501 and 502 of wire 500 are fixed via deposition of an affixing coating 590 (not drawn to scale), such as $SiO_2$ or $Al_2O_3$. The membrane (i.e., substrate) 580 is bent periodically by a source of mechanical movement 585, represented by a two-sided arrow to indicate a vertical vibration and displacement in this embodiment. The source of mechanical movement 585 is coupled to the substrate 580, to which nanowire 500 attached. The source of mechanical movement 585 that generates mechanical strain in the nanowire 500 may be, for example an eccentric motor, which creates movement to a degree such that the wire 500 is stretched (e.g., to 1%), after which it is released to zero strain. The mechanical strain (i.e., stress) on nanowire 500 created by the movement may include axial strain, bending strain, torsional strain or any combination thereof. Once the internal breakdown field is reached, electron and hole pairs are formed and radiatively recombine after releasing the external strain.

In a further embodiment, many piezoelectric wires 500 are deposited on top of a substrate 580 that is a piezo element. The piezo element that vibrates at high frequencies, such as tens of kHz or higher up to the GHz range. For example, the cycling of the mechanical movement (and consequently the electrical field) may have a frequency on the order of 100 kHz, or at least 50 kHz, or at least 80 kHz, or at least 100 kHz. The wire 500 and piezo element (substrate 580) are components of the overall light emitting device 600. In some embodiments, many piezoelectric nanowires 500 can be placed on the substrate 580 to form a bulk of wires with significant resonances on surface, such as a stack of thin-film piezo nanowire layers to increase strain.

The coupling of the wire to the piezo element substrate will allow a simple excitation, avoiding high voltage circuits. Again, measures to reduce the breakdown field may be incorporated, such as doping with electron and hole donors, thereby reducing the required strain that is applied. For example, electron donor doping will allow single electrons to be released into the conduction band at lower fields, where it can create electron hole pairs via impact ionization. Alternatively, if donor and acceptor doping is present, the electrons and holes can be emitted at low fields via thermal field emission (Poole-Frenkel emission). In other embodiments, part or all of the wire is replaced with a material of low breakdown, so that electron-hole pairs are generated in this modified region. Doping the wire with elements that will release charges is another way to reduce the breakdown field.

An example of a structure designed with reduced breakdown is a wire with an inner core 510 of bandgap A, an outer core 520 of piezoelectric material of bandgap B, and a cladding 530 of non-piezoelectric material C. The bandgaps are $E_A < E_B < E_C$. The outer core 520 is doped with donors and acceptors (or alternatively with color centers) so that the breakdown field is significantly reduced in outer core 520. During breakdown the electrons and holes will be collected at opposite ends of the wire in the inner core 510, where the potential energy is minimal. On zero bias the electrons and holes recombine in inner core 510, away from the defects and doping of outer core 520. Cladding layer 530 encapsulates the charges to the constraint of the wire.

In some embodiments, the piezoelectric nanowires can be aligned with each other to increase light out-coupling. The alignment can be achieved by, for example, submitting the wires to a standing wave created by ultrasound. Other methods of aligning the wires are also possible, such as having grooves or patterns in the membrane to help orient the wires.

Nanowire Fabrication

Figures 7A, 7B:
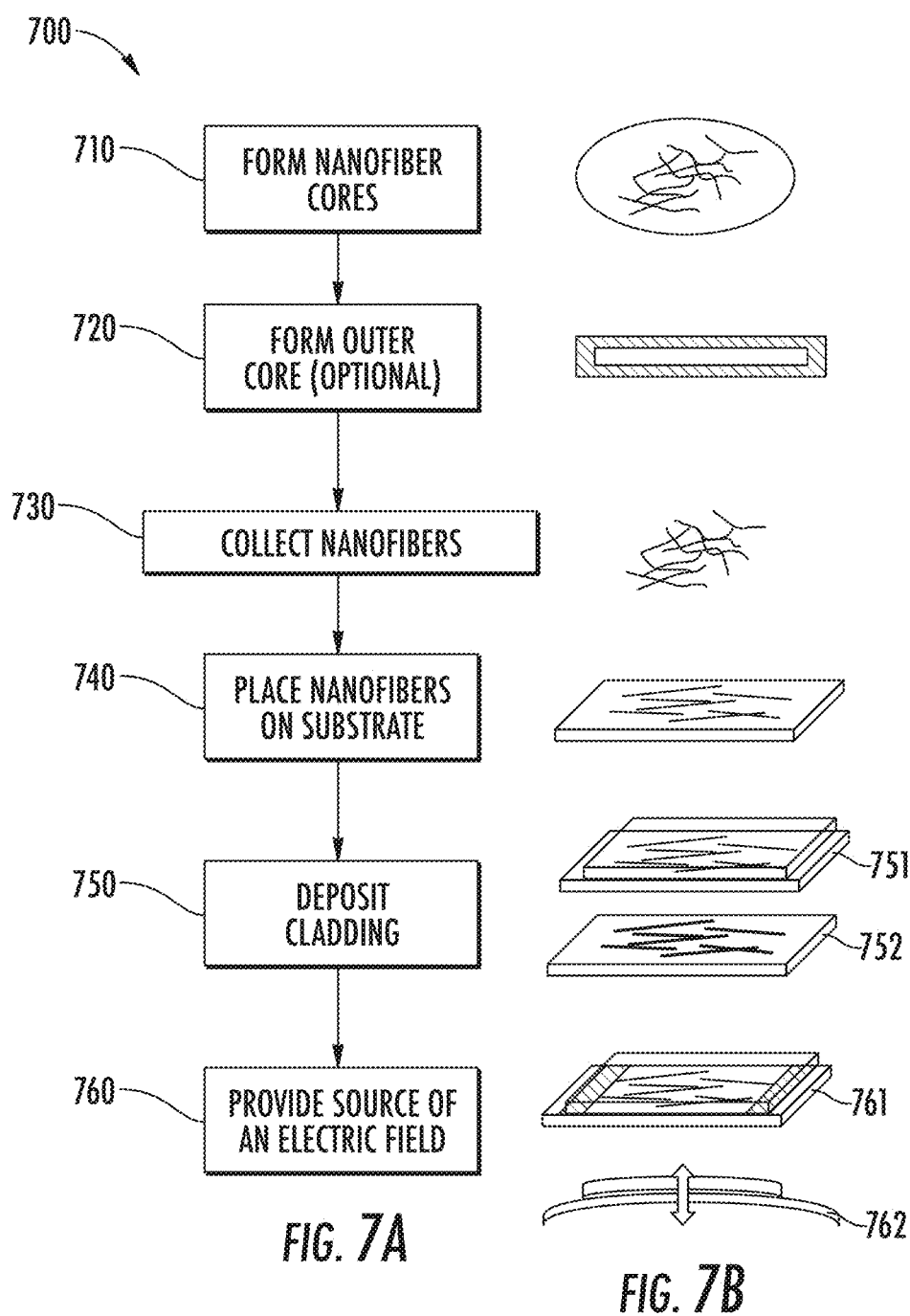
FIGS. 7A-7B show a flowchart of fabricating a light emitting device, in accordance with some embodiments.

FIG. 7A is an example flowchart 700 of methods for fabricating nanowire light emitting devices, in accordance with the present embodiments. FIG. 7B shows pictorials representing steps of the methods, where the pictorials are placed adjacent to the corresponding steps. Step 710 involves forming a plurality of nanowires, the nanowires comprising cores made of a semiconductor material. In step 710, a large number of cores for the wires can be grown in epitaxial reactors and possibly also by other methods such as, but not limited to, chemical vapor deposition (CVD). The wires are usually grown in parallel mode on surfaces and can be harvested by ultrasonic energy. In the present embodiments, the isolated semiconductor cores of the nanowires are formed in a process that is independent of the assembly of the device itself. Diameters of the core wires can be from, for example, 10 nm to 1 micron.

In optional step 720 for embodiments where the core comprises an inner and outer core, the outer core is formed. For example, the outer core 135 of FIG. 3A in the external electric field stimulated devices, and the outer core 520 of FIG. 5A in the piezoelectric devices, cover the cylindrical and end surfaces of the inner core material 132 or 510, respectively. ALD can be used to deposit the outer core in embodiments where the outer core is an oxide. The outer core can have thicknesses of, for example, 1 nm to 1000 nm. In other embodiments, the inner core and outer core need not be distinct from each other but can be mixed with each other such that the entire core is formed in step 710. For example, in a piezoelectric wire the wire core 515 can be a single core that contains dopants such that the core 515 performs both functions of creating piezoelectric strain and supplying electrons and holes for recombination.

In some embodiments of steps 710 and 720, color centers can be added to the inner and/or outer cores for either the external electric field nanowire devices or the piezoelectric wire devices.

In step 730, the plurality of nanowires is collected. The nanowires can be harvested by, for example, using ultrasonic energy or mechanical methods. Once collected, in step 740 the plurality of nanowires can be placed and redistributed on a planar or otherwise shaped surface that serves as the device substrate.

In step 750, the cladding is deposited on the nanowires, such as by CVD or ALD. The cladding has a breakdown voltage larger than a breakdown voltage of the cores. For example, the nanowires can be covered in a dielectric to form the cladding layer 140 of FIG. 1 (graphic 751 of FIG. 7B), or the cladding layer 530 in FIG. 5 can be formed around the wire core 515 (graphic 752 of FIG. 7B). The thickness of the cladding can be, for example, tens of nanometers to one micron thickness.

In step 760, a source of an electric field is provided, which in operation of the light emitting device provides the electric field to the plurality of nanowires. Cores of the plurality of nanowires are at least partially aligned with and lie at least partially within the electric field such that a cycling of the electric field creates charge separation and electron-hole recombination in the cores. The cycling can be, for example, periodic.

For the electric field stimulated devices represented by graphic 761 of FIG. 7B, the nanowires are located within the electric field created by the electric field source, which can be a pair of electrodes or an electrode grid. One or more pairs of electrodes may be provided, at different orientations relative to each other. In some embodiments, the electrodes are deposited on top of wires that have already been placed on an insulator-coated substrate. In other embodiments of the electric field stimulated devices, the electrodes could first be formed within or onto the substrate, with an insulating material deposited over the electrodes, prior to the wires being placed on the substrate. The insulating material serves as an insulator separating the pair of electrodes from the plurality of nanowires. In any of these external electric field embodiments, an electrical circuit is coupled to the electrodes, where the electric field is created by the electrical circuit and cycles between a zero bias and a non-zero bias.

In the piezoelectric embodiments of step 760, the electric field source is a piezoelectric material which in operation creates an electric field when subjected to mechanical strain. The piezoelectric material is part of the wire core, such as being incorporated into a single semiconductor material core. In other embodiments, the piezoelectric material can be a separate, outer core layer covering an inner core, where the outer core has a wider bandgap than the inner core. In graphic 762 of FIG. 7B the piezoelectric nanowires are attached to the substrate, and movement of the substrate (e.g., mechanical resonant vibration) creates and releases mechanical strain on the piezoelectric material of the core, thereby creating the cycling of the electrical field. The movement can be caused by, for example, mechanical movement or ultrasonic energy. In some embodiments the movement can be provided by a piezo crystal vibrating in resonance.

Various embodiments of FIG. 7A may use a different order or combination of the steps. For instance, piezoelectric embodiments may provide the source of the electric field at steps 710 and/or 720 combined with step 760, by forming the piezoelectric material as part of the core. External electric field embodiments may provide the electrodes at step 760 prior to the deposition of the cladding in step 750. In another example, deposition of the cladding in step 750 can be performed prior to placing nanowires on the substrate in step 740.

In some embodiments, the wires may be aligned while they are unbound on the surface, although this is not required. In embodiments with multiple pairs of electrodes, the wires need not be aligned. In certain embodiments the substrate on which the wires are mounted is transparent to the UV-C, and light is extracted from the bottom surface of the substrate (the surface opposite that on which the wires are laid). In an external electric field embodiment of such a device, the structure sequence would be: substrate, wire, insulator (cladding), metal (electrodes), and another insulator to cover the electrodes. However, light emission from an inverted build is also possible (e.g., substrate, metal, first insulator, wire, second insulator).

In an example process of fabricating a nanowire light-emitting device, nanowire inner cores of GaN or AlN/GaN SL with an AlN outer core layer are grown in an epitaxial reactor to a length of up to 1000 nm, ideally with isotropic length distribution. The wires are harvested, such as by emitting ultrasound waves into fluid, and dispersed onto a substrate. In the case of an electric field-initiated device, the substrate can be a quartz wafer surface having subsurface, planarized, insulated electrode arrays, and the wires are deposited stochastically on the surface as the fluid is evaporated. A cladding layer of $SiO_2$ is deposited on top of the surface in a CVD process. In some embodiments, the backside of the wafer is metallized for added reflectivity, such as with Al which has high reflectivity in the DUV range.

The wires of the present embodiments can also be passivated during formation of the wires. For example, ALD, PECVD or other processes may be used to lock the wires in place and protect the device from breakdown in air. The passivation may also act as a replacement for the outer core AlN.

The breakdown field in the wire can be advantageously reduced by adding p- and n-doping or step variations in the bandgap in order to facilitate the release of electrons for impact ionization/avalanche processes. At the same time, the wide bandgap outer core is required to permanently withstand the high electric field over the lifetime of the device. In some embodiments the entire core can be doped, while in other embodiments the wire core can have a composite construction where only some parts are doped. Example dopants include, but are not limited to, Si, Mg, or other elements.

A low breakdown voltage in the wire is desirable as it will allow a wider range of host materials. GaN breakdown occurs at 150 MV/m, while $SiO_2$ breaks down at 1000 MV/m. Thus, GaN for the core wire material with $SiO_2$ as the outer cladding material provides a possible combination. Tuning of the breakdown voltage may be done by simultaneous doping with donors and acceptors and/or by providing electrically active defects in a controlled way during growth.

In some embodiments, the recombination may optionally be enhanced by forming a center wire heterojunction during growth with reduced bandgap.

It is also important to avoid leakage of charges out of or into the wire, as the resulting net-charge will inhibit breakdown and render the wire inoperable Likewise, if there is a misbalance of electron and hole trapping, the remaining species will charge the wire and will inhibit further operating.

The required wavelength to be emitted by the wire can be adjusted via a number of measures. Some examples include a ternary mix of the wire core, an AlN/GaN SL in the wire, or an AlN wire with an AlGaN quantum well (QW) in the center. Another example is by using a GaN wire of sub 10 nm diameter.

The requirements on the wire material is rather low, as neither doping nor electric contact formations are required. Hence, further materials can be found that form direct bandgap semiconducting bandgaps in the UV-C range with a sufficiently low breakdown voltage. There are many possibilities to grow wires, dope wires, step the bandgap of wires, and strain wires to generate the required breakdown characteristics.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A light emitting device comprising:
a substrate;
a plurality of nanowires placed on the substrate, wherein each nanowire in the plurality of nanowires comprises a core made of a semiconductor material;
a cladding enclosing each nanowire and having a breakdown voltage larger than a breakdown voltage of the core; and
a source of an electric field, wherein the cores are at least partially aligned with and lie at least partially within the electric field such that a cycling of the electric field creates charge separation and electron-hole recombination in the cores.

2. The light emitting device of claim 1, wherein:
the semiconductor material is a piezoelectric material and is the source of the electric field;
the plurality of nanowires is attached to the substrate;
movement of the substrate creates and releases mechanical strain on the piezoelectric material of the cores; and
the mechanical strain on the piezoelectric material of the cores creates the cycling of the electric field.

3. The light emitting device of claim 2, further comprising a source of mechanical movement coupled to the substrate to create the mechanical strain; and
wherein the cycling of the electric field has a frequency of at least 50 kHz.

4. The light emitting device of claim 1, wherein the cores comprise color centers.

5. The light emitting device of claim 1, wherein:
the cores comprise an inner core and an outer core, the outer core covering the inner core;
the outer cores have a wider bandgap than the inner cores, are made of a piezoelectric material and are the source of the electric field;
the plurality of nanowires is attached to the substrate;
movement of the substrate creates and releases mechanical strain on the outer cores; and
the mechanical strain on the outer cores creates the cycling of the electric field.

6. The light emitting device of claim 1, further comprising:
a pair of electrodes on the substrate; and
an electrical circuit coupled to the pair of electrodes, wherein the electric field is generated through the pair of electrodes by the electrical circuit and cycles between a zero bias and a non-zero bias; and
wherein at least part of the plurality of nanowires is located within the electric field generated by the electrical circuit.

7. The light emitting device of claim 6, further comprising an insulator on the pair of electrodes, separating the pair of electrodes from the nanowire.

8. The light emitting device of claim 6, wherein the electric field cycles with a frequency of at least 50 kHz.

9. The light emitting device of claim 6, wherein:
the semiconductor material of the core has a bandgap; and
the electric field has a voltage of at least 1.5 times the bandgap.

10. The light emitting device of claim 6, wherein a distance between the pair of electrodes is from 0.5 micron to 1 mm.

11. The light emitting device of claim 2, wherein the movement comprises vibration of the substrate.

12. The light emitting device of claim 5, wherein the outer core is doped with donors and acceptors.

* * * * *